(12) United States Patent
Hu

(10) Patent No.: US 11,552,832 B2
(45) Date of Patent: *Jan. 10, 2023

(54) DATA SAMPLING CIRCUIT AND DATA SAMPLING DEVICE

(71) Applicant: CHANGXIN MEMORY TECHNOLOGIES, INC., Hefei (CN)

(72) Inventor: Jianfei Hu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/732,485

(22) Filed: Apr. 28, 2022

(65) Prior Publication Data

US 2022/0263690 A1    Aug. 18, 2022

Related U.S. Application Data

(63) Continuation of application No. 17/313,005, filed on May 6, 2021, now Pat. No. 11,388,030, which is a continuation of application No. PCT/CN2020/103356, filed on Jul. 21, 2020.

(30) Foreign Application Priority Data

Jan. 14, 2020   (CN) .......................... 202010037846.8
Jan. 14, 2020   (CN) .......................... 202020081575.1

(51) Int. Cl.
     *H04L 25/03*       (2006.01)
(52) U.S. Cl.
     CPC .. *H04L 25/03057* (2013.01); *H04L 25/03146* (2013.01); *H04L 25/03878* (2013.01); *H04L 2025/0349* (2013.01)

(58) Field of Classification Search
     CPC ......... H04L 25/03057; H04L 25/03146; H04L 2025/0349; H04K 25/03878
     USPC ....................................................... 375/233
     See application file for complete search history.

(56) References Cited

U.S. PATENT DOCUMENTS

| 10,320,370 B2* | 6/2019 | Choudhary ....... H04L 25/03057 |
| 2012/0063242 A1 | 3/2012 | Kim et al. |
| 2019/0164594 A1 | 5/2019 | Eom et al. |
| 2021/0067309 A1 | 3/2021 | Hu |

FOREIGN PATENT DOCUMENTS

| WO | 2020167431 A1 | 8/2020 |
| WO | 2021027208 A1 | 2/2021 |

* cited by examiner

*Primary Examiner* — Leila Malek
(74) *Attorney, Agent, or Firm* — Kilpatrick Townsend & Stockton LLP

(57) ABSTRACT

Embodiments provide a data sampling circuit and a data sampling device. The sampling circuit includes: a first sampling module configured to respond to a signal from a data signal terminal and a signal from a reference signal terminal and to act on a first node and a second node; a second sampling module configured to respond to a signal from the first node and a signal from the second node and to act on a third node and a fourth node; a latch module configured to input a high level signal to a first output terminal and input a low level signal to a second output terminal or input the low level signal to the first output terminal and input the high level signal to the second output terminal according to a signal from the third node and a signal from the fourth node; and a decision feedback equalization module.

18 Claims, 6 Drawing Sheets

DATA SAMPLING CIRCUIT AND DATA SAMPLING DEVICE

CROSS REFERENCE

This application is a continuation of U.S. patent application Ser. No. 17/313,005, filed on May 6, 2021, which is a continuation of PCT/CN2020/103356, filed on Jul. 21, 2020, which claims priority to Chinese Patent Application No. 202010037846.8 and 202020081575.1, titled "DATA SAMPLING CIRCUIT AND DATA SAMPLING DEVICE" and filed on Jan. 14, 2020, the entire contents of which are incorporated herein by reference.

TECHNICAL FIELD

The present disclosure generally relates to the field of storage technologies, and more particularly, to a data sampling circuit and a data sampling device.

BACKGROUND

In low power double data rate (LPDDR) memories, as signal transmission rate becomes faster and faster, channel loss has an increasing negative effect on signal quality, which will cause intersymbol interference.

In related technologies, typically an equalizer is arranged at a receiver (RX) to compensate for a channel. A continuous time linear equalizer (CTLE) or a decision feedback equalizer (DFE) may be selected as the equalizer.

However, a separate equalizer may increase power consumption of the LPDDR, such that the LPDDR cannot meet requirements for lower power consumption.

SUMMARY

According to one aspect of the present disclosure, there is provided a data sampling circuit, which includes a first sampling module, a second sampling module, a latch module, and a decision feedback equalization module. The first sampling module is connected to a data signal terminal, a reference signal terminal, a first node, and a second node. The first sampling module is configured to respond to a signal from the data signal terminal and a signal from the reference signal terminal and to act on the first node and the second node. The second sampling module is connected to the first node, the second node, a third node, and a fourth node. The second sampling module is configured to respond to a signal from the first node and a signal from the second node and to act on the third node and the fourth node. The latch module is connected to the third node, the fourth node, a first output terminal, and a second output terminal. The latch module is configured to input a high level signal to the first output terminal and input a low level signal to the second output terminal or input the low level signal to the first output terminal and input the high level signal to the second output terminal according to a signal from the third node and a signal from the fourth node. The decision feedback equalization module is connected in parallel to the second sampling module and is configured to reduce intersymbol interference.

In an exemplary embodiment of the present disclosure, the data sampling circuit also includes an offset compensation module, wherein the offset compensation module is connected in parallel to the second sampling module and is configured to compensate for an offset voltage of the second sampling module.

In an exemplary embodiment of the present disclosure, the first sampling module is also connected to a first clock signal terminal and is configured to start a sampling action in response to a signal from the first clock signal terminal. The data sampling circuit also includes a reset module, wherein the reset module is connected to the first clock signal terminal, a second clock signal terminal, the first node, the second node, the third node, the fourth node, the first output terminal, and the second output terminal. The reset module is configured to reset the first node and the second node in response to the signal from the first clock signal terminal, and to reset the third node, the fourth node, the first output terminal and the second output terminal in response to a signal from the second clock signal terminal.

In an exemplary embodiment of the present disclosure, the first sampling module includes a first P-type transistor, a second P-type transistor, and a third P-type transistor. A first terminal of the first P-type transistor is connected to a high-level signal terminal, a control terminal of the first P-type transistor is connected to the first clock signal terminal, and a second terminal of the first P-type transistor is connected to a fifth node.

A first terminal of the second P-type transistor is connected to the second terminal of the first P-type transistor, a control terminal of the second P-type transistor is connected to the data signal terminal, and a second terminal the second P-type transistor is connected to the second node. A first terminal of the third P-type transistor is connected to the second terminal of the first P-type transistor, a control terminal of the third P-type transistor is connected to the reference signal terminal, and a second terminal of the third P-type transistor is connected to the first node.

In an exemplary embodiment of the present disclosure, the second sampling module includes a fourth N-type transistor and a fifth N-type transistor. A first terminal of the fourth N-type transistor is connected to a low-level signal terminal, a control terminal of the fourth N-type transistor is connected to the second node, and a second terminal of the fourth N-type transistor is connected to the third node. A first terminal of the fifth N-type transistor is connected to the low-level signal terminal, a control terminal of the fifth N-type transistor is connected to the first node, and a second terminal of the fifth N-type transistor is connected to the fourth node.

In an exemplary embodiment of the present disclosure, the latch module includes a sixth P-type transistor, a seventh N-type transistor, an eighth P-type transistor, and a ninth N-type transistor. A first terminal of the sixth P-type transistor is connected to the high-level signal terminal, a control terminal of the sixth P-type transistor is connected to the second output terminal, and a second terminal of the sixth P-type transistor is connected to the first output terminal. A first terminal of the seventh N-type transistor is connected to the third node, a second terminal of the seventh N-type transistor is connected to the first output terminal, and a control terminal of the seventh N-type transistor is connected to the second output terminal. A first terminal of the eighth P-type transistor is connected to the high-level signal terminal, a control terminal of the eighth P-type transistor is connected to the first output terminal, and a second terminal of the eighth P-type transistor is connected to the second output terminal. A first terminal of the ninth N-type transistor is connected to the fourth node, a second terminal of the ninth N-type transistor is connected to the second output terminal, and a control terminal of the ninth N-type transistor is connected to the first output terminal.

In an exemplary embodiment of the present disclosure, the decision feedback equalization module includes a first decision feedback equalization module and a second decision feedback equalization module. The first decision feedback equalization module is connected in parallel between a source terminal of the fourth N-type transistor and a drain terminal of the fourth N-type transistor, and is configured to compensate for a parameter of the fourth N-type transistor. The second decision feedback equalization module is connected in parallel between a source terminal of the fifth N-type transistor and a drain terminal of the fifth N-type transistor, and is configured to compensate for a parameter of the fifth N-type transistor. The first decision feedback equalization module and the second decision feedback equalization module are controlled by two reverse signals and are driven by one of the two reverse signals.

In an exemplary embodiment of the present disclosure, the first decision feedback equalization module includes a plurality of tenth N-type transistors, a plurality of eleventh transistors, and a plurality of twelfth N-type transistors. A first terminal of each of the plurality of tenth N-type transistors is connected to the third node, and a control terminal of each of the plurality of tenth N-type transistors is connected to the second node. The plurality of eleventh transistors are arranged in one-to-one correspondence with the plurality of tenth N-type transistors. A first terminal of each of the plurality of eleventh transistors is connected to a second terminal of each of the plurality of tenth N-type transistors, and a control terminal of each of the plurality of eleventh transistors is respectively connected to different control signal terminals. The plurality of twelfth N-type transistors are arranged in one-to-one correspondence with the plurality of eleventh transistors. A first terminal of each of the plurality of twelfth N-type transistors is connected to a second terminal of each of the plurality of eleventh transistors, a control terminal of each of the plurality of twelfth N-type transistors is connected to a first control signal terminal, and a second terminal of each of the plurality of twelfth N-type transistors is connected to the low-level signal terminal.

In an exemplary embodiment of the present disclosure, the second decision feedback equalization module includes a plurality of thirteenth N-type transistors, a plurality of fourteenth transistors, and a plurality of fifteenth N-type transistors. A first terminal of each of the plurality of thirteenth N-type transistors is connected to the fourth node, and a control terminal of each of the plurality of thirteenth N-type transistors is connected to the first node. The plurality of fourteenth transistors are arranged in one-to-one correspondence with the plurality of thirteenth N-type transistors. A first terminal of each of the plurality of fourteenth transistors is connected to a second terminal of each of the plurality of thirteenth N-type transistors, and a control terminal of each of the plurality of fourteenth transistors is respectively connected to different control signal terminals. The plurality of fifteenth N-type transistors are arranged in one-to-one correspondence with the plurality of fourteenth transistors. A first terminal of each of the plurality of fifteenth N-type transistors is connected to a second terminal of each of the plurality of fourteenth transistors, a control terminal of each of the plurality of fifteenth N-type transistors is connected to a second control signal terminal, and a second terminal of each of the plurality of fifteenth N-type transistors is connected to the low-level signal terminal. A signal from the first control signal terminal and a signal from the second control signal terminal are reverse.

In an exemplary embodiment of the present disclosure, the number of the plurality of tenth N-type transistors, the number of the plurality of eleventh transistors and the number of the plurality of twelfth N-type transistors are two, respectively.

In an exemplary embodiment of the present disclosure, the number of the plurality of thirteenth N-type transistors, the number of the plurality of fourteenth transistors and the number of the plurality of fifteenth N-type transistors are two, respectively.

In an exemplary embodiment of the present disclosure, the offset compensation module includes a first offset compensation module and a second offset compensation module. The first offset compensation module is connected in parallel between a source terminal of the fourth N-type transistor and a drain terminal of the fourth N-type transistor, and is configured to compensate for a parameter of the fourth N-type transistor. The second offset compensation module is connected in parallel between a source terminal of the fifth N-type transistor and a drain terminal of the fifth N-type transistor, and is configured to compensate for a parameter of the fifth N-type transistor.

In an exemplary embodiment of the present disclosure, the first offset compensation module includes a plurality of sixteenth transistors and a plurality of first capacitors. A first terminal of each of the plurality of sixteenth transistors is connected to the low-level signal terminal, and a control terminal of each of the plurality of sixteenth transistors is respectively connected to different control signal terminals. The plurality of first capacitors are arranged in one-to-one correspondence with the plurality of sixteenth transistors, wherein each of the plurality of first capacitors is connected between a second terminal of each of the plurality of sixteenth transistors and the third node.

In an exemplary embodiment of the present disclosure, the second offset compensation module includes a plurality of seventeenth transistors and a plurality of second capacitors. A first terminal of each of the plurality of seventeenth transistors is connected to the low-level signal terminal, and a control terminal of each of the plurality of seventeenth transistors is respectively connected to different control signal terminals. The plurality of second capacitors are arranged in one-to-one correspondence with the plurality of seventeenth transistors, wherein each of the plurality of second capacitors is connected between a second terminal of each of the plurality of seventeenth transistors and the third node.

In an exemplary embodiment of the present disclosure, the reset module includes an eighteenth N-type transistor, a nineteenth N-type transistor, a twentieth P-type transistor, a twenty-first P-type transistor, a twenty-second P-type transistor, and a twenty-third P-type transistor. A first terminal of the eighteenth N-type transistor is connected to a low-level signal terminal, a second terminal of the eighteenth N-type transistor is connected to the second node, and a control terminal of the eighteenth N-type transistor is connected to the first clock signal terminal. A first terminal of the nineteenth N-type transistor is connected to the low-level signal terminal, a second terminal of the nineteenth N-type transistor is connected to the first node, and a control terminal of the nineteenth N-type transistor is connected to the first clock signal terminal. A first terminal of the twentieth P-type transistor is connected to a high-level signal terminal, a second terminal of the twentieth P-type transistor is connected to the third node, and a control terminal of the twentieth P-type transistor is connected to the second clock signal terminal. A first terminal of the twenty-first P-type transistor is connected to the high-level signal terminal, a second terminal of the twenty-first P-type transistor is connected to the first output terminal, and a control terminal of the twenty-first P-type transistor is connected to the second clock signal terminal. A first terminal of the twenty-second P-type transistor is connected to the high-level signal terminal, a second terminal of the twenty-second P-type transistor is connected to the second output terminal, and a control terminal of the twenty-second P-type transistor is connected to the second clock signal terminal. A first terminal of the twenty-third P-type transistor is connected to the high-level signal terminal, a second terminal of the twenty-third P-type transistor is connected to the fourth node, and a control terminal of the twenty-third P-type transistor is connected to the second clock signal terminal.

According to another aspect of the present disclosure, there is provided a data sampling device, which includes a plurality of cascaded data sampling circuits as mentioned above. A first output terminal of a given one of the plurality of data sampling circuits at a previous stage is connected to a first control terminal of an adjacent one of the plurality of data sampling circuits at a next stage, and a second output terminal of the data sampling circuit at the previous stage is connected to a second control terminal of the adjacent data sampling circuit at the next stage. A first output terminal of a given one of the plurality of data sampling circuits at a last stage is connected to a first control terminal of one of the plurality of data sampling circuits at a first stage, and a second output terminal of the data sampling circuit at the last stage is connected to a second control terminal of the data sampling circuit at the first stage.

In an exemplary embodiment of the present disclosure, the data sampling device also includes a plurality of latches, wherein the plurality of latches are arranged in one-to-one correspondence with the plurality of data sampling circuits. The plurality of latches are configured to latch data from the first output terminals of the plurality of data sampling circuits at a third output terminal, and latch data from the second output terminals of the plurality of data sampling circuits at a fourth output terminal.

In an exemplary embodiment of the present disclosure, each of the plurality of latches includes a twenty-fourth P-type transistor, a twenty-fifth P-type transistor, a twenty-sixth P-type transistor, a twenty-seventh P-type transistor, a twenty-eighth N-type transistor, a twenty-ninth N-type transistor, a thirtieth N-type transistor, and a thirty-first N-type transistor. A first terminal of the twenty-fourth P-type transistor is connected to a high-level signal terminal, a second terminal of the twenty-fourth P-type transistor is connected to the third output terminal, and a control terminal of the twenty-fourth P-type transistor is connected to the first output terminal of each of the plurality of data sampling circuits. A first terminal of the twenty-fifth P-type transistor is connected to the high-level signal terminal, a second terminal of the twenty-fifth P-type transistor is connected to the third output terminal, and a control terminal of the twenty-fifth P-type transistor is connected to the fourth output terminal. A first terminal of the twenty-sixth P-type transistor is connected to the high-level signal terminal, a second terminal of the twenty-sixth P-type transistor is connected to the fourth output terminal, and a control terminal of the twenty-sixth P-type transistor is connected to the third output terminal. A first terminal of the twenty-seventh P-type transistor is connected to the high-level signal terminal, a second terminal of the twenty-seventh P-type transistor is connected to the fourth output terminal, and a control terminal of the twenty-seventh P-type transistor is connected to the second output terminal of each of the plurality of data sampling circuits. A first terminal of the twenty-eighth N-type transistor is connected to a low-level signal terminal, a second terminal of the twenty-eighth N-type transistor is connected to the third output terminal, and a control terminal of the twenty-eighth N-type transistor is connected to the first output terminal of each of the plurality of data sampling circuits. A first terminal of the twenty-ninth N-type transistor is connected to the low-level signal terminal, a second terminal of the twenty-ninth N-type transistor is connected to the third output terminal, and a control terminal of the twenty-ninth N-type transistor is connected to the fourth output terminal. A first terminal of the thirtieth N-type transistor is connected to the low-level signal terminal, a second terminal of the thirtieth N-type transistor is connected to the fourth output terminal, and a control terminal of the thirtieth N-type transistor is connected to the third output terminal. A first terminal of the thirty-first N-type transistor is connected to the low-level signal terminal, a second terminal of the thirty-first N-type transistor is connected to the fourth output terminal, and a control terminal of the thirty-first N-type transistor is connected to the second output terminal of each of the plurality of data sampling circuits.

In an exemplary embodiment of the present disclosure, the data sampling device includes four data sampling circuits, and the data sampling device also includes a clock circuit configured to provide clock sampling signals to first clock signal terminals of the four data sampling circuits. A phase difference between the clock sampling signals on the first clock signal terminals of the adjacent data sampling circuits is 90 degrees, and a period of each of the clock sampling signals on the first clock signal terminals is twice that of a signal on a data signal terminal.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

The exemplary embodiment will now be described more fully with reference to the accompanying drawings. However, the exemplary embodiments can be implemented in a variety of forms and should not be construed as limited to the embodiments set forth herein. Rather, the embodiments are provided so that the present disclosure will be thorough and complete and will fully convey the concepts of exemplary embodiments to those skilled in the art. Throughout the drawings, similar reference signs indicate the same or similar structures, and their detailed description will be omitted.

Although this specification uses relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". Other relative terms such as "high", "low", "top", "bottom", "left", "right" and so on also have similar meanings. When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc.

Figure 1:
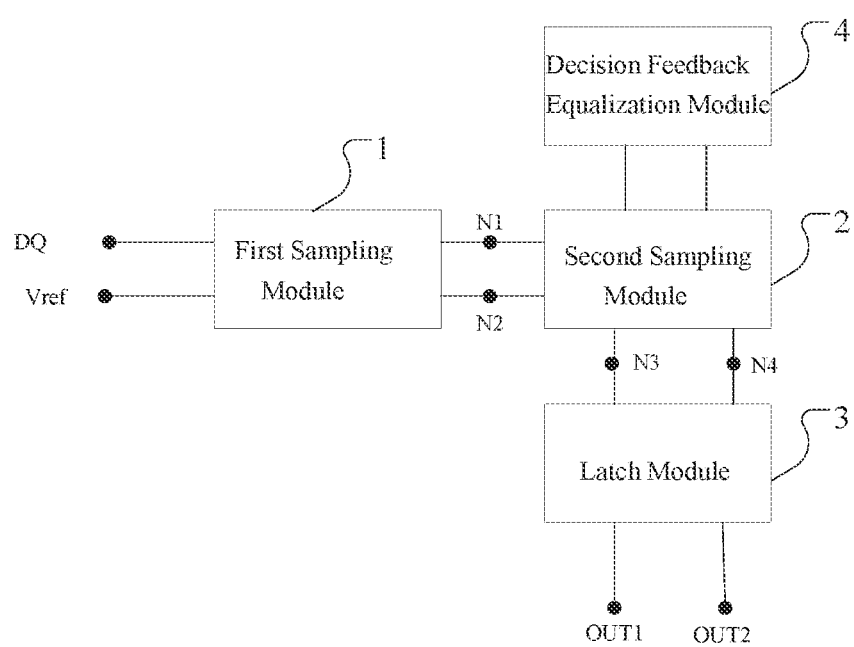
FIG. 1 is a schematic structural diagram of a data sampling circuit according to an exemplary embodiment of the present disclosure.

This exemplary embodiment first provides a data sampling circuit. As shown in FIG. 1, a schematic structural diagram of a data sampling circuit according to an exemplary embodiment of the present disclosure is illustrated. The data sampling circuit includes a first sampling module 1, a second sampling module 2, a latch module 3, and a decision feedback equalization module 4. The first sampling module 1 is connected to a data signal terminal Data Queue (DQ), a reference signal terminal Vref, a first node N1, and a second node N2. The first sampling module 1 is configured to respond to a signal from the data signal terminal DQ and a signal from the reference signal terminal Vref and to act on the first node N1 and the second node N2. The second sampling module 2 is connected to the first node N1, the second node N2, a third node N3, and a fourth node N4. The second sampling module 2 is configured to respond to a signal from the first node N1 and a signal from the second node N2 and to act on the third node N3 and the fourth node N4. The latch module 3 is connected to the third node N3, the fourth node N4, a first output terminal OUT1, and a second output terminal OUT2. The latch module 3 is configured to input a high level signal to the first output terminal OUT1 and input a low level signal to the second output terminal OUT2 or input the low level signal to the first output terminal OUT1 and input the high level signal to the second output terminal OUT2 according to a signal from the third node N3 and a signal from the fourth node N4. The decision feedback equalization module 4 is connected in parallel to the second sampling module and is configured to reduce intersymbol interference by equivalently regulating the signal from the data signal terminal DQ.

In one aspect, in the present disclosure, the decision feedback equalization module is integrated into the data sampling circuit, and parameters of transistors in the second sampling module are adjusted through the decision feedback equalization module, which is equivalent to adjusting the signal from the data signal terminal, such that intersymbol interference between signals from output terminals of a plurality of data sampling circuits is reduced. Compared with the related technologies, the decision feedback equalization module in the present disclosure can reduce the intersymbol interference through a simple circuit structures, such that power consumption of a memory device is reduced. In another aspect, the data sampling circuit of the present disclosure adopts two-stage sampling modules, namely the first sampling module and the second sampling module. In this way, feedback noises generated by the first output terminal and the second output terminal to the data signal terminal and the reference signal terminal can be reduced. In still another aspect, in the present disclosure, the decision feedback equalization module is arranged in parallel to the second sampling module, such that a negative effect of the decision feedback equalization module on a sampling speed of the data sampling circuit can be minimized.

Figure 2:
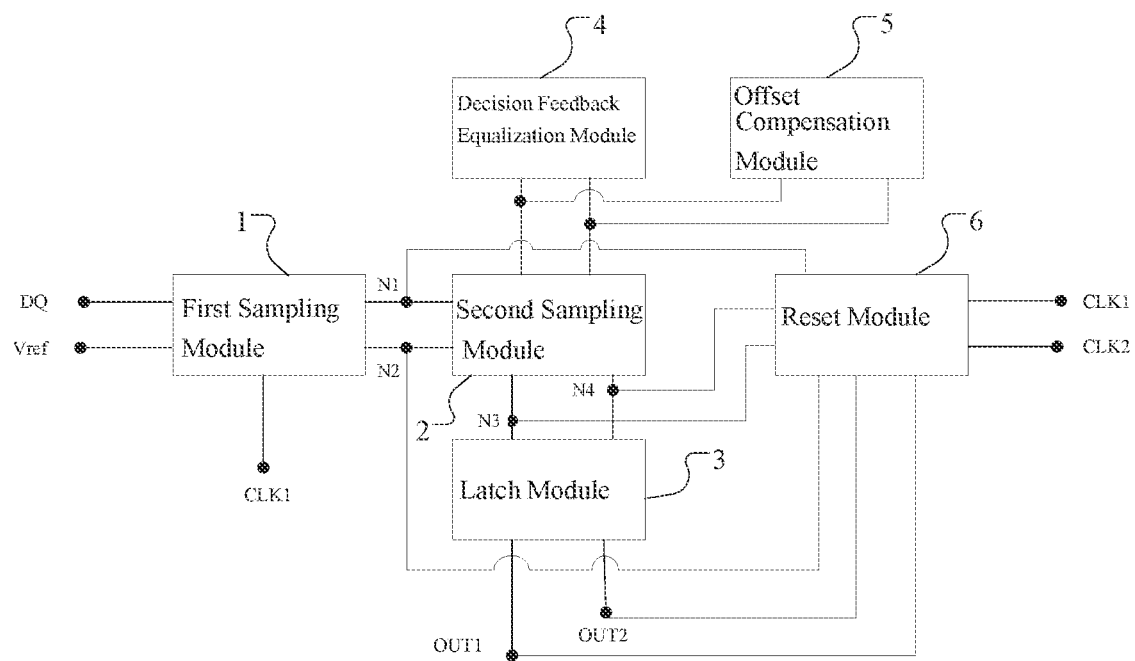
FIG. 2 is a schematic structural diagram of a data sampling circuit according to another exemplary embodiment of the present disclosure.

In this exemplary embodiment, as shown in FIG. 2, a schematic structural diagram of a data sampling circuit according to another exemplary embodiment of the present disclosure is illustrated. The sampling circuit may also include an offset compensation module 5, wherein the offset compensation module 5 is connected in parallel to the second sampling module 2, and may be configured to compensate for an offset voltage of the second sampling module 2 by compensating for a parameter of a transistor in the second sampling module 2.

In this exemplary embodiment, as shown in FIG. 2, the first sampling module may also be connected to a first clock signal terminal CLK1, and is configured to start a sampling action in response to a signal from the first clock signal terminal CLK1. The data sampling circuit may also include a reset module 6. The reset module 6 is connected to the first clock signal terminal CLK1, a second clock signal terminal CLK2, the first node N1, the second node N2, the third node N3, the fourth node N4, the first output terminal OUT1, and the second output terminal OUT2. The reset module 6 is configured to reset the first node N1 and the second node N2 in response to the signal from the first clock signal terminal CLK1, and to reset the third node N3, the fourth node N4, the first output terminal OUT1 and the second output terminal OUT2 in response to a signal from the second clock signal terminal CLK2.

Figure 3:
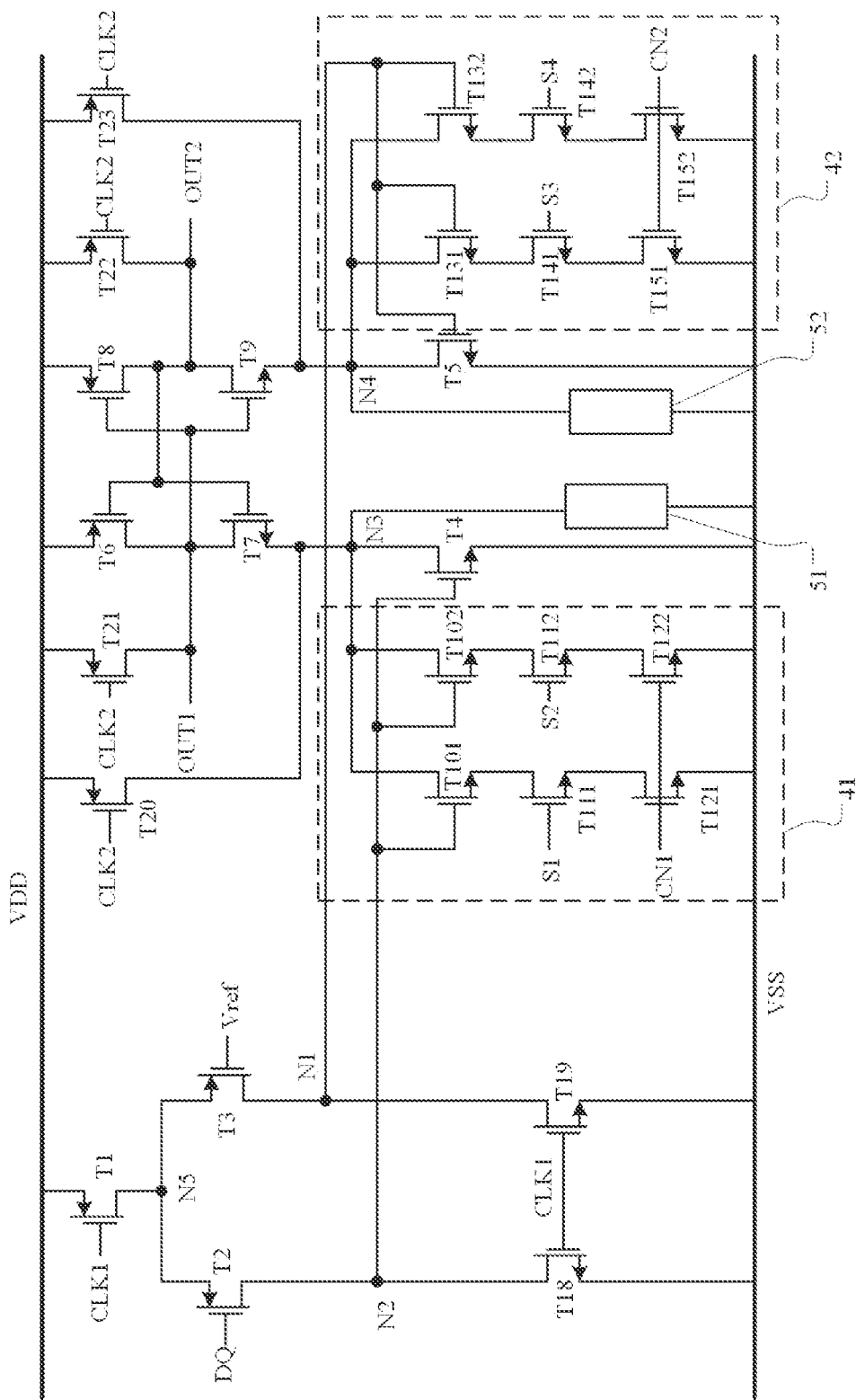
FIG. 3 is a schematic structural diagram of a data sampling circuit according to still another exemplary embodiment of the present disclosure.

In this exemplary embodiment, as shown in FIG. 3, a schematic structural diagram of a data sampling circuit according to still another exemplary embodiment of the present disclosure is illustrated. The first sampling module may include a first P-type transistor T1, a second P-type transistor T2, and a third P-type transistor T3. A first terminal of the first P-type transistor T1 is connected to a high-level signal terminal VDD, a control terminal of the first P-type transistor T1 is connected to the first clock signal terminal CLK1, and a second terminal of the first P-type transistor T1 is connected to a fifth node N5. A first terminal of the second P-type transistor T2 is connected to the second terminal of the first P-type transistor T1, a control terminal of the second P-type transistor T2 is connected to the data signal terminal DQ, and a second terminal the second P-type transistor T2 is connected to the second node N2. A first terminal of the third P-type transistor T3 is connected to the second terminal of the first P-type transistor T1, a control terminal of the third P-type transistor T3 is connected to the reference signal terminal Vref, and a second terminal of the third P-type transistor T3 is connected to the first node N1.

In this exemplary embodiment, as shown in FIG. 3, the second sampling module 2 may include a fourth N-type transistor T4 and a fifth N-type transistor T5. A first terminal of the fourth N-type transistor T4 is connected to a low-level signal terminal VSS, a control terminal of the fourth N-type transistor T4 is connected to the second node N2, and a second terminal of the fourth N-type transistor T4 is connected to the third node N3. A first terminal of the fifth N-type transistor T5 is connected to the low-level signal terminal VSS, a control terminal of the fifth N-type transistor T5 is connected to the first node N1, and a second terminal of the fifth N-type transistor T5 is connected to the fourth node N4.

In this exemplary embodiment, as shown in FIG. 3, the latch module 3 may include a sixth P-type transistor T6, a seventh N-type transistor T7, an eighth P-type transistor T8, and a ninth N-type transistor T9. A first terminal of the sixth P-type transistor T6 is connected to the high-level signal terminal VDD, a control terminal of the sixth P-type transistor T6 is connected to the second output terminal OUT2, and a second terminal of the sixth P-type transistor T6 is connected to the first output terminal OUT1. A first terminal of the seventh N-type transistor T7 is connected to the third node N3, a second terminal of the seventh N-type transistor T7 is connected to the first output terminal OUT1, and a control terminal of the seventh N-type transistor T7 is connected to the second output terminal OUT2. A first terminal of the eighth P-type transistor T8 is connected to the high-level signal terminal VDD, a control terminal of the eighth P-type transistor T8 is connected to the first output terminal OUT1, and a second terminal of the eighth P-type transistor T8 is connected to the second output terminal OUT2. A first terminal of the ninth N-type transistor T9 is connected to the fourth node N4, a second terminal of the ninth N-type transistor T9 is connected to the second output terminal OUT2, and a control terminal of the ninth N-type transistor T9 is connected to the first output terminal OUT1.

In this exemplary embodiment, as shown in FIG. 3, the decision feedback equalization module 4 may include a first decision feedback equalization module 41 and a second decision feedback equalization module 42. The first decision feedback equalization module 41 is connected in parallel between a source terminal of the fourth N-type transistor T4 and a drain terminal of the fourth N-type transistor T4, and is configured to compensate for a parameter of the fourth N-type transistor T4. The second decision feedback equalization module 42 is connected in parallel between a source terminal of the fifth N-type transistor T5 and a drain terminal of the fifth N-type transistor T5, and is configured to compensate for a parameter of the fifth N-type transistor T5. The first decision feedback equalization module 41 and the second decision feedback equalization module 42 are controlled by two reverse signals and are driven by one of the two reverse signals.

In this exemplary embodiment, as shown in FIG. 3, the first decision feedback equalization module 41 may include two tenth N-type transistors T101 and T102, two eleventh transistors T111 and T112, and two twelfth N-type transistors T121 and T122. A first terminal of each of the two tenth N-type transistors T101 and T102 is connected to the third node N3, and a control terminal of each of the two tenth N-type transistors T101 and T102 is connected to the second node N2. The eleventh transistor T111 is arranged in correspondence with the tenth N-type transistor T101, and the eleventh transistor T112 is arranged in correspondence with the tenth N-type transistor T102. A first terminal of the eleventh transistor T111 is connected to a second terminal of the tenth N-type transistor T101, and a control terminal of the eleventh transistor T111 is connected to a control signal terminal S1. A first terminal of the eleventh transistor T112 is connected to a second terminal of the tenth N-type transistor T102, and a control terminal of the eleventh transistor T112 is connected to a control signal terminal S2. The twelfth N-type transistor T121 is arranged in correspondence with the eleventh transistor T111, and the twelfth N-type transistor T122 is arranged in correspondence with the eleventh transistor T112. A first terminal of the twelfth N-type transistor 121 is connected to a second terminal of the eleventh transistor 111, a control terminal of the twelfth N-type transistor 121 is connected to a first control signal terminal CN1, and a second terminal of the twelfth N-type transistor 121 is connected to the low-level signal terminal VSS. A first terminal of the twelfth N-type transistor 122 is connected to a second terminal of the eleventh transistor 112, a control terminal of the twelfth N-type transistor 122 is connected to the first control signal terminal CN1, and a second terminal of the twelfth N-type transistor 122 is connected to the low-level signal terminal VSS.

In this exemplary embodiment, the second decision feedback equalization module 42 may include two thirteenth N-type transistors T131 and T132, two fourteenth transistors T141 and T142, and two fifteenth N-type transistors T151 and T152. A first terminal of each of the two thirteenth N-type transistors T131 and T132 is connected to the fourth node N4, and a control terminal of each of the two thirteenth N-type transistors T131 and T132 is connected to the first node N1. The fourteenth transistor T141 is arranged in correspondence with the thirteenth N-type transistor T131, and the fourteenth transistor T142 is arranged in correspondence with the thirteenth N-type transistor T132. A first terminal of the fourteenth transistor T141 is connected to a second terminal of the thirteenth N-type transistor T131, and a control terminal of the fourteenth transistor T141 is connected to a control signal terminal S3. A first terminal of the fourteenth transistor T142 is connected to a second terminal of the thirteenth N-type transistor T132, and a control terminal of the fourteenth transistor T142 is connected to a control signal terminal S4. The fifteenth N-type transistor T151 is arranged in correspondence with the fourteenth transistor T141, and the fifteenth N-type transistor T152 is arranged in correspondence with the fourteenth transistor T142. A first terminal of the fifteenth N-type transistor T151 is connected to a second terminal of the fourteenth transistor T141, a control terminal of the fifteenth N-type transistor T151 is connected to a second control signal terminal CN2, and a second terminal of the fifteenth N-type transistor T151 is connected to the low-level signal terminal VSS. A first terminal of the fifteenth N-type transistor T152 is connected to a second terminal of the fourteenth transistor T142, a control terminal of the fifteenth N-type transistor T152 is connected to the second control signal terminal CN2, and a second terminal of the fifteenth N-type transistor T152 is connected to the low-level signal terminal VSS. A signal from the first control signal terminal and a signal from the second control signal terminal are reverse. That is, among the signal from the first control signal terminal and the signal from the second control signal terminal, one is at a high level, and the other one is at a low level.

In this exemplary embodiment, the tenth N-type transistors T101 and T102 may be selectively connected in parallel to two sides of the fourth N-type transistor T4 by means of the signals from the control signal terminals S1 and S2 and the first control signal terminal CN1. In this way, parameter adjustment may be implemented for the fourth N-type transistor T4 in different modes. Similarly, the thirteenth N-type transistors T131 and T132 may be selectively connected in parallel to two sides of the fifth N-type transistor T5 by means of the signals from the control signal terminals S3 and S4 and the second control signal terminal CN2. In this way, parameter adjustment may be implemented for the fifth N-type transistor T5 in different modes. The quantity of parameter adjustment of the fourth N-type transistor T4 by the transistor T101 and the transistor T102 may be equal or may be different. The quantity of parameter adjustment of the fifth N-type transistor T5 by the transistor T131 and the transistor T132 may be equal or may be different.

It is to be understood that in other exemplary embodiments, the number of the tenth N-type transistors may be other numerical values, and accordingly, the number of the tenth N-type transistors, the number of the eleventh transistors and the number of the twelfth N-type transistors are equal. The number of the thirteenth N-type transistors may be other numerical values, and accordingly, the number of the thirteenth N-type transistors, the number of the fourteenth transistors and the number of the fifteenth N-type transistors are equal.

In this exemplary embodiment, the offset compensation module 5 may include a first offset compensation module 51 and a second offset compensation module 52. The first offset compensation module 51 is connected in parallel between a source terminal of the fourth N-type transistor T4 and a drain terminal of the fourth N-type transistor T4, and is configured to compensate for a parameter of the fourth N-type transistor T4. The second offset compensation module 52 is connected in parallel between a source terminal of the fifth N-type transistor T5 and a drain terminal of the fifth N-type transistor T5, and is configured to compensate for a parameter of the fifth N-type transistor T5. The first offset compensation module 51 and the second offset compensation module 52 may adjust the offset voltage of the data sampling circuit by compensating for the parameter of the fourth N-type transistor T4 and the parameter of the fifth N-type transistor T5.

Figure 4:
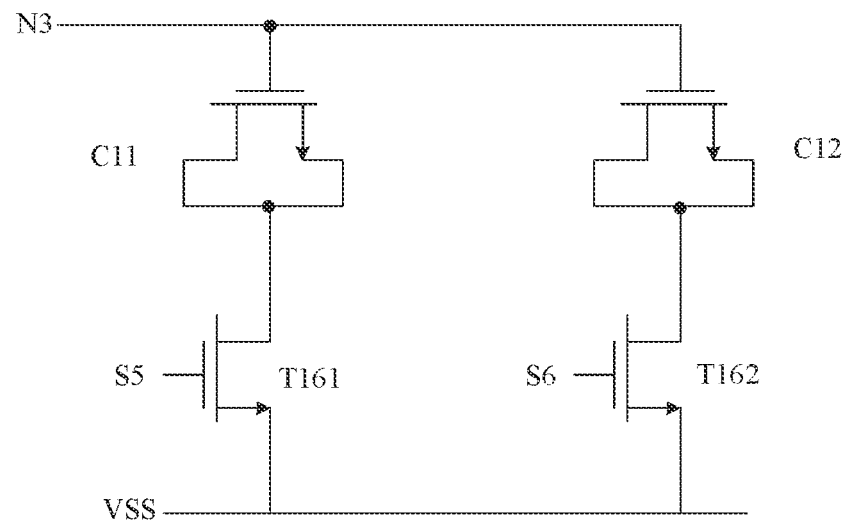
FIG. 4 is a schematic structural diagram of a first offset compensation module in a data sampling circuit according to an exemplary embodiment of the present disclosure.

In this exemplary embodiment, as shown in FIG. 4, a schematic structural diagram of a first offset compensation module in the data sampling circuit according to an exemplary embodiment of the present disclosure is illustrated. The first offset compensation module may include two sixteenth transistors T161 and T162, and two first capacitors C11 and C12. A first terminal of the sixteenth transistor T161 is connected to the low-level signal terminal VSS, and a control terminal of the sixteenth transistor T161 is connected to a control signal terminal S5. A first terminal of the sixteenth transistor T162 is connected to the low-level signal terminal VSS, and a control terminal of the sixteenth transistor T162 is connected to a control signal terminal S6. The first capacitor C11 is arranged in correspondence with the sixteenth transistor T161, and the first capacitor C12 is arranged in correspondence with the sixteenth transistor T162. The first capacitor C11 is connected between a second terminal of the sixteenth transistor T161 and the third node N3, and the first capacitor C12 is connected between a second terminal of the sixteenth transistor T162 and the third node N3.

Figure 5:
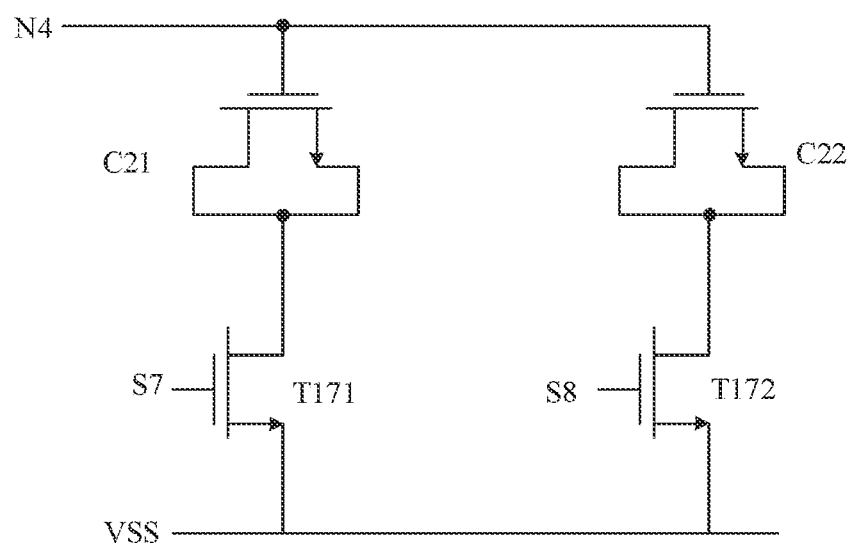
FIG. 5 is a schematic structural diagram of a second offset compensation module in a data sampling circuit according to an exemplary embodiment of the present disclosure.

In this exemplary embodiment, as shown in FIG. 5, a schematic structural diagram of a second offset compensation module in the data sampling circuit according to an exemplary embodiment of the present disclosure is illustrated. The second offset compensation module may include two seventeenth transistors T171 and T172, and two second capacitors C21 and C22. A first terminal of the seventeenth transistor T171 is connected to the low-level signal terminal VSS, and a control terminal of the seventeenth transistor T171 is connected to a control signal terminal S7. A first terminal of the seventeenth transistor T172 is connected to the low-level signal terminal VSS, and a control terminal of the seventeenth transistor T172 is connected to a control signal terminal S8. The second capacitor C21 is arranged in correspondence with the seventeenth transistor T171, and the second capacitor C22 is arranged in correspondence with the seventeenth transistor T172. The second capacitor C21 is connected between a second terminal of the seventeenth transistor T171 and the third node N3, and the second capacitor C22 is connected between a second terminal of the seventeenth transistor T172 and the third node N3.

In this exemplary embodiment, the first capacitors C11 and C12 may be selectively connected in parallel to two sides of the fourth N-type transistor T4 by means of the signals from the control signal terminals S5 and S6. In this way, parameter adjustment may be implemented for the fourth N-type transistor T4 in different modes. Similarly, the second capacitors C21 and C22 may be selectively connected in parallel to two sides of the fifth N-type transistor T5 by means of the signals from the control signal terminals S7 and S8. In this way, parameter adjustment may be implemented for the fifth N-type transistor T5 in different modes. The quantity of parameter adjustment of the fourth N-type transistor T4 by the capacitors C11 and C12 may be equal or may be different. The quantity of parameter adjustment of the fifth N-type transistor T5 by the capacitors C21 and C22 may be equal or may be different.

It is to be understood that in other exemplary embodiments, the number of the sixteenth transistors may be other numerical values, and accordingly, the number of the sixteenth transistors and the number of the first capacitors are equal. The number of the seventeenth transistors may be other numerical values, and accordingly, the number of the seventeenth transistors and the number of the second capacitors are equal. In addition, similar to the feedback equalization modules, the offset compensation module can also adjust the parameter of the fourth N-type transistor T4 and the parameter of the fifth N-type transistor T5 by incorporating a transistor into the fourth N-type transistor T4 and the fifth N-type transistor T5.

In this exemplary embodiment, as shown in FIG. 3, the reset module may include an eighteenth N-type transistor T18, a nineteenth N-type transistor T19, a twentieth P-type transistor T20, a twenty-first P-type transistor T21, a twenty-second P-type transistor T22, and a twenty-third P-type transistor T23. A first terminal of the eighteenth N-type transistor T18 is connected to the low-level signal terminal VSS, a second terminal of the eighteenth N-type transistor T18 is connected to the second node N2, and a control terminal of the eighteenth N-type transistor T18 is connected to the first clock signal terminal CLK1. A first terminal of the nineteenth N-type transistor T19 is connected to the low-level signal terminal VSS, a second terminal of the nineteenth N-type transistor T19 is connected to the first node N1, and a control terminal of the nineteenth N-type transistor T19 is connected to the first clock signal terminal CLK1. A first terminal of the twentieth P-type transistor T20 is connected to the high-level signal terminal VDD, a second terminal of the twentieth P-type transistor T20 is connected to the third node N3, and a control terminal of the twentieth P-type transistor T20 is connected to the second clock signal terminal CLK2. A first terminal of the twenty-first P-type transistor T21 is connected to the high-level signal terminal VDD, a second terminal of the twenty-first P-type transistor T21 is connected to the first output terminal OUT1, and a control terminal of the twenty-first P-type transistor T21 is connected to the second clock signal terminal CLK2. A first terminal of the twenty-second P-type transistor T22 is connected to the high-level signal terminal VDD, a second terminal of the twenty-second P-type transistor T22 is connected to the second output terminal OUT2, and a control terminal of the twenty-second P-type transistor T22 is connected to the second clock signal terminal CLK2. A first terminal of the twenty-third P-type transistor T23 is connected to the high-level signal terminal VDD, a second terminal of the twenty-third P-type transistor T23 is connected to the fourth node N4, and a control terminal of the twenty-third P-type transistor T23 is connected to the second clock signal terminal CLK2.

A working process of the data sampling circuit provided by this exemplary embodiment is divided into four phases: a resetting phase, a first sampling phase, a second sampling phase, and a latching phase.

In the resetting phase, the first clock signal terminal CLK1 is at a high level, the second clock signal terminal CLK2 is at a low level, and the eighteenth N-type transistor T18 and the nineteenth N-type transistor T19 are enabled; the first node N1 and the second node N2 are at low levels, and the twentieth P-type transistor T20, the twenty-first P-type transistor T21, the twenty-second P-type transistor T22, and the twenty-third P-type transistor T23 are enabled; and the third node N3, the fourth node N4, the first output terminal OUT1 and the second output terminal OUT2 are at high levels.

In the first sampling phase, the first clock signal terminal CLK1 is at a low level, the second clock signal terminal CLK2 is at a high level, the eighteenth N-type transistor T18 and the nineteenth N-type transistor T19 are disabled, and the twentieth P-type The transistor T20, the twenty-first P-type transistor T21, the twenty-second P-type transistor T22, and the twenty-third P-type transistor T23 are disabled. Meanwhile, the first P-type transistor T1 is enabled, the second P-type transistor T2 charges the second node under the action of the signal from the data signal terminal DQ, and the third P-type transistor T3 charges the first node under the action of the signal from the reference signal terminal Vref. This phase lasts until the fourth N-type transistor T4 or the fifth N-type transistor T5 is enabled first. For example, when the voltage of the data signal terminal DQ is lower than that of the reference signal terminal Vref, the fourth N-type transistor T4 is enabled first.

In the second sampling phase, reference is made by taking an example where the voltage of the data signal terminal DQ is less than that of the reference signal terminal Vref, after the fourth N-type transistor T4 is first enabled, the third node is discharged until the seventh N-type transistor T7 is enabled first. In the second sampling phase, the decision feedback equalization module 4 can compensate for the parameter of the fourth N-type transistor T4 and the parameter of the fifth N-type transistor T5, which is equivalent to controlling the voltage of the data signal terminal DQ. In this way, intersymbol interference between signals from output terminals of different data sampling circuits is reduced.

In the latching phase, after the seventh N-type transistor T7 is enabled, the first output terminal OUT1 is set at a low level; and in the meanwhile, the eighth P-type transistor T8 is enabled under the action of the first output terminal OUT1, such that the second output terminal OUT2 is set at a high level.

Similarly, when the voltage of the data signal terminal DQ is greater than that of the reference signal terminal Vref, the first output terminal OUT1 is set at a high level, and the second output terminal OUT2 is set at a low level.

This exemplary embodiment also provides a data sampling device, which includes a plurality of cascaded data sampling circuits as mentioned above. A first output terminal of a given one of the plurality of data sampling circuits at a previous stage is connected to a first control signal terminal of an adjacent one of the plurality of data sampling circuits at a next stage, and a second output terminal of the data sampling circuit at the previous stage is connected to a second control signal terminal of the adjacent data sampling circuit at the next stage. A first output terminal of a given one of the plurality of data sampling circuits at a last stage is connected to a first control signal terminal of one of the plurality of data sampling circuits at a first stage, and a second output terminal of the data sampling circuit at the last stage is connected to a second control signal terminal of the data sampling circuit at the first stage.

Figure 6:
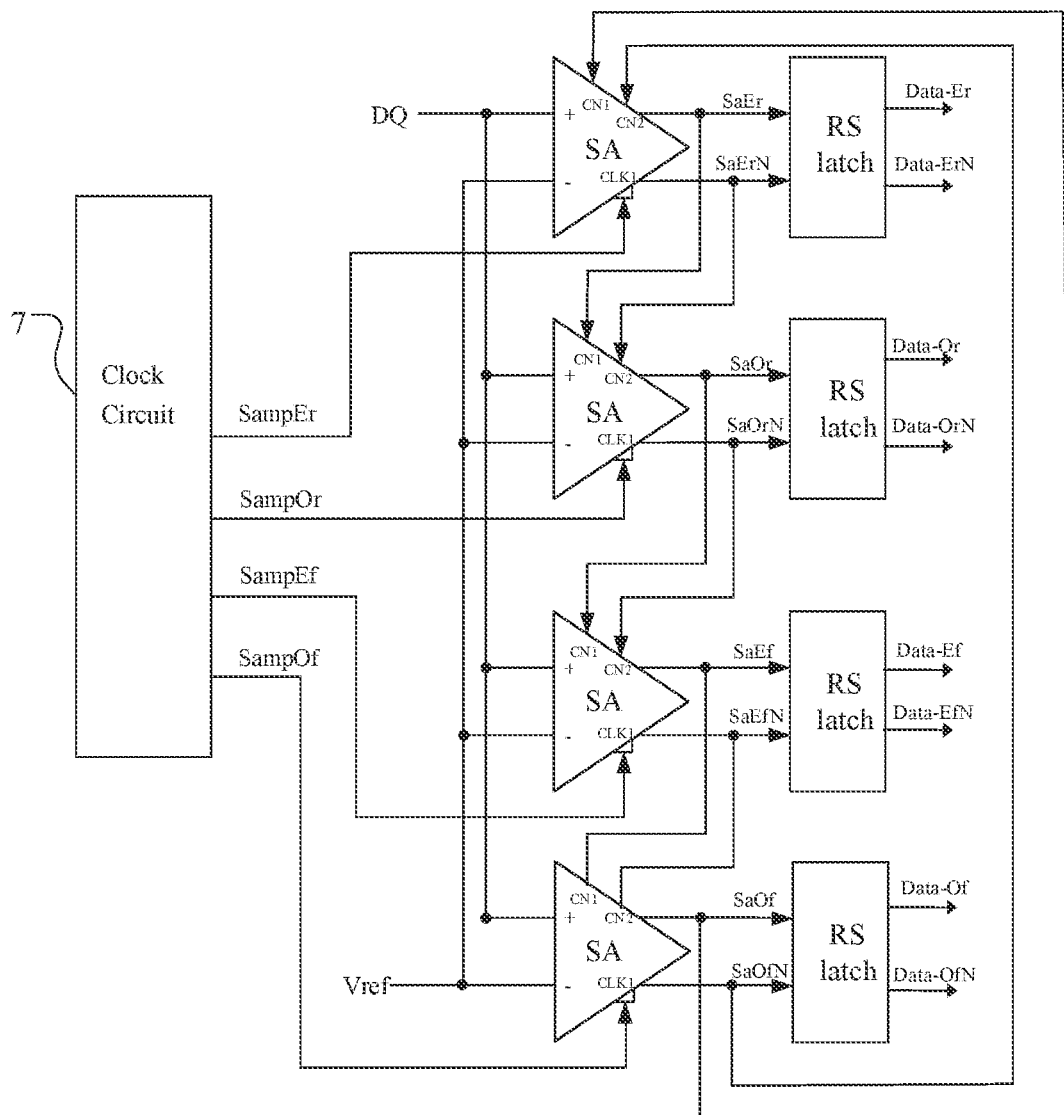
FIG. 6 is a schematic structural diagram of a data sampling device according to an exemplary embodiment of the present disclosure.

In this exemplary embodiment, as shown in FIG. 6, a schematic structural diagram of a data sampling device according to an exemplary embodiment of the present disclosure is illustrated. In this exemplary embodiment, reference is made by taking an example where the data sampling device includes four data sampling circuits SA as an example. A first output terminal SaEr of the first-stage data sampling circuit SA is connected to the first control signal terminal CN1 of the second-stage data sampling circuit SA, and a second output terminal SaErN of the first-stage data sampling circuit SA is connected to the second control signal terminal CN2 of the second-stage data sampling circuit SA. A first output terminal SaOr of the second-stage data sampling circuit SA is connected to the first control signal terminal CN1 of the third-stage data sampling circuit SA, and a second output terminal SaOrN of the second-stage data sampling circuit SA is connected to the second control signal terminal CN2 of the third-stage data sampling circuit SA. A first output terminal SaEf of the third-stage data sampling circuit SA is connected to the first control signal terminal CN1 of the fourth-stage data sampling circuit SA, and a second output terminal SaEfN of the third-stage data sampling circuit SA is connected to the second control signal terminal CN2 of the fourth-stage data sampling circuit SA. A first output terminal SaOf of the fourth-stage data sampling circuit SA is connected to the first control signal terminal CN1 of the first-stage data sampling circuit SA, and a second output terminal SaOfN of the fourth-stage data sampling circuit SA is connected to the second control signal terminal CN2 of the first-stage data sampling circuit SA. In this exemplary embodiment, the first output terminal of the data sampling circuits at the previous stage is directly connected to the first control signal terminal of the adjacent data sampling circuit at the next stage, and the second output terminal of the data sampling circuit at the previous stage is connected to the second control signal terminal of the data sampling circuit at the next stage. Therefore, data may be transmitted without passing through the latch, such that data transmission delay is reduced.

Figure 7:
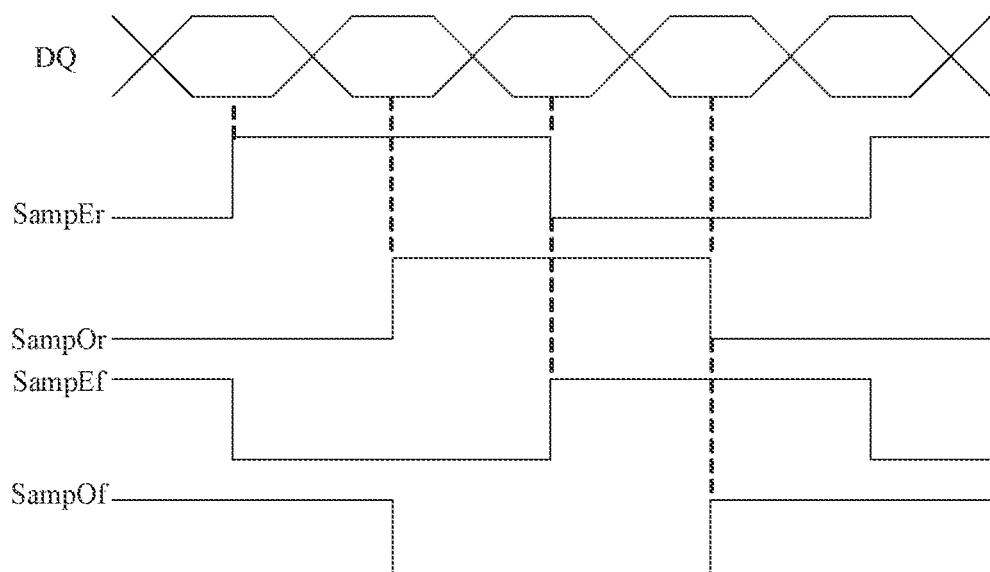
FIG. 7 is a timing chart of a clock sampling signal in a data sampling device according to an exemplary embodiment of the present disclosure.

In this exemplary embodiment, as shown in FIG. 6, the data sampling device may also include a clock circuit 7. The clock circuit 7 is configured to provide clock sampling signals SampEr, SampOr, SampEf and SampOf to the first clock signal terminals CLK1 of the four data sampling circuits, respectively. As shown in FIG. 7, a timing chart of a clock sampling signal in the data sampling device according to an exemplary embodiment of the present disclosure is illustrated. A phase difference between the clock sampling signals on the first clock signal terminals CLK1 of the adjacent data sampling circuits is 90 degrees, and a period of each of the clock sampling signals on the first clock signal terminals CLK1 is twice that of a signal on the data signal terminal DQ. A sampling clock is set to 2T, which can facilitate clock routing and save power consumption. The clock circuit may be composed of a WCK receiving circuit and an orthogonal distributor.

In this exemplary embodiment, the data sampling device may also include a plurality of latches, wherein the plurality of latches are arranged in one-to-one correspondence with the plurality of data sampling circuits. The plurality of latches are configured to latch data from the first output terminals of the plurality of data sampling circuits at a third output terminal, and latch data from the second output terminals of the plurality of data sampling circuits at a fourth output terminal. As shown in FIG. 6, the number of RS latches may be four. The RS latches are arranged in one-to-one correspondence with the data sampling circuits SA. The latch connected to the first-stage data sampling circuit SA may latch a signal from the first output terminal SaEr at a third output terminal Data-Er of this latch, and meanwhile may latch a signal from the second output terminal SaErN at a fourth output terminal Data-ErN of this latch. The latch connected to the second-stage data sampling circuit SA may latch a signal from the first output terminal SaOr at a third output terminal Data-Or of this latch, and meanwhile may latch a signal from the second output terminal SaOrN at a fourth output terminal Data-OrN of this latch. The latch connected to the third-stage data sampling circuit SA may latch a signal from the first output terminal SaEf at a third output terminal Data-Ef of this latch, and meanwhile may latch a signal from the second output terminal SaEfN at a fourth output terminal Data-EfN of this latch. The latch connected to the fourth-stage data sampling circuit SA may latch a signal from the first output terminal SaOf at a third output terminal Data-Of of this latch, and meanwhile may latch a signal from the second output terminal SaOfN at a fourth output terminal Data-OfN of this latch.

Figure 8:
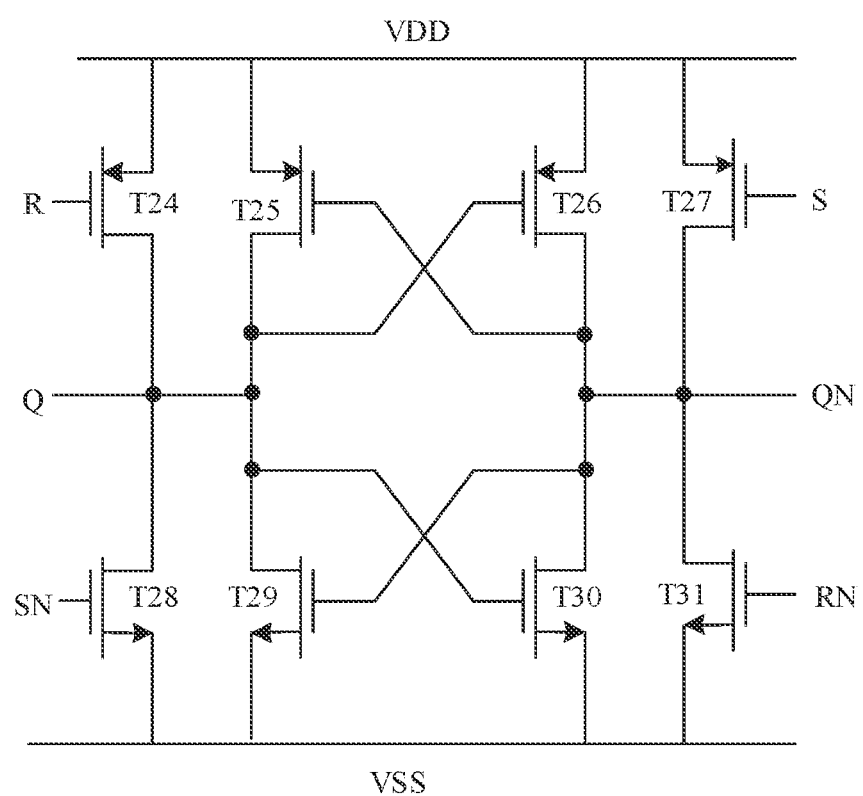
FIG. 8 is a schematic structural diagram of a latch in a data sampling device according to an exemplary embodiment of the present disclosure.

In this exemplary embodiment, as shown in FIG. 8, a schematic structural diagram of a latch in the data sampling circuit according to an exemplary embodiment of the present disclosure is illustrated. The latch may include a twenty-fourth P-type transistor T24, a twenty-fifth P-type transistor T25, a twenty-sixth P-type transistor T26, a twenty-seventh P-type transistor T27, a twenty-eighth N-type transistor T28, a twenty-ninth N-type transistor T29, a thirtieth N-type transistor T30, and a thirty-first N-type transistor T31. A first terminal of the twenty-fourth P-type transistor T24 is connected to a high-level signal terminal VDD, a second terminal of the twenty-fourth P-type transistor T24 is connected to an output terminal Q, and a control terminal of the twenty-fourth P-type transistor T24 is connected to an input terminal R. A first terminal of the twenty-fifth P-type transistor is connected to the high-level signal terminal VDD, a second terminal of the twenty-fifth P-type transistor is connected to the output terminal Q, and a control terminal of the twenty-fifth P-type transistor is connected to an output terminal QN. A first terminal of the twenty-sixth P-type transistor is connected to the high-level signal terminal VDD, a second terminal of the twenty-sixth P-type transistor is connected to the output terminal QN, and a control terminal of the twenty-sixth P-type transistor is connected to the output terminal Q. A first terminal of the twenty-seventh P-type transistor is connected to the high-level signal terminal VDD, a second terminal of the twenty-seventh P-type transistor is connected to the output terminal QN, and a control terminal of the twenty-seventh P-type transistor is connected to an input terminal S. A first terminal of the twenty-eighth N-type transistor is connected to a low-level signal terminal VSS, a second terminal of the twenty-eighth N-type transistor is connected to the output terminal Q, and a control terminal of the twenty-eighth N-type transistor is connected to an input terminal SN. A first terminal of the twenty-ninth N-type transistor is connected to the low-level signal terminal VSS, a second terminal of the twenty-ninth N-type transistor is connected to the output terminal Q, and a control terminal of the twenty-ninth N-type transistor is connected to the output terminal QN. A first terminal of the thirtieth N-type transistor is connected to the low-level signal terminal VSS, a second terminal of the thirtieth N-type transistor is connected to the output terminal QN, and a control terminal of the thirtieth N-type transistor is connected to the output terminal Q. A first terminal of the thirty-first N-type transistor is connected to the low-level signal terminal VSS, a second terminal of the thirty-first N-type transistor is connected to the output terminal QN, and a control terminal of the thirty-first N-type transistor is connected to an input terminal RN. A signal from the input terminal RN and a signal from the input terminal R are reverse signals, and a signal from the input terminal SN and a signal from the input terminal S are reverse signals. The input terminals R and SN of the latch may be connected to the first output terminal of the data sampling circuit, and the input terminals S and RN of the latch may be connected to the second output terminal of the data sampling circuit. The latch adopts a completely symmetrical structure, which ensures pull-up output and pull-down output to be completely symmetrical, such that a data transmission speed may be increased.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:
1. A data sampling circuit, comprising:
   a first sampling circuit connected to a first clock signal terminal, and configured to receive a data signal and output a first signal and a second signal, and start a sampling action in response to a signal from the first clock signal terminal;

a second sampling circuit connected to the first sampling circuit and configured to receive the first signal and the second signal, and output a third signal and a fourth signal;

a latch module connected to the second sampling circuit, having a first output terminal and a second output terminal, and configured to at least:
  input a high level signal to the first output terminal and input a low level signal to the second output terminal, or
  input the low level signal to the first output terminal and input the high level signal to the second output terminal according to the third signal and a fourth signal; and a decision feedback equalization module connected in parallel to the second sampling circuit and configured to reduce intersymbol interference; and, wherein the data sampling circuit is further configured to reset the first signal and the second signal in response to the signal from the first clock signal terminal, and to reset the third signal, the fourth signal, the first output terminal and the second output terminal in response to a signal from a second clock signal terminal.

2. The data sampling circuit according to claim 1, further comprising:
an offset compensating circuit connected in parallel to the second sampling circuit and configured to compensate for an offset voltage of the second sampling circuit.

3. The data sampling circuit according to claim 2, wherein the second sampling circuit comprises:
a fourth N-type transistor, a first terminal of the fourth N-type transistor being connected to a low-level signal terminal, a control terminal of the fourth N-type transistor being connected to a second node for receiving the second signal, and a second terminal of the fourth N-type transistor being connected to a third node for outputting the third signal; and
a fifth N-type transistor, a first terminal of the fifth N-type transistor being connected to the low-level signal terminal, a control terminal of the fifth N-type transistor being connected to a first node for receiving the first signal, and a second terminal of the fifth N-type transistor being connected to a fourth node for outputting the fourth signal.

4. The data sampling circuit according to claim 3, wherein the offset compensating circuit comprises:
a first offset compensating circuit, connected in parallel between a source terminal of the fourth N-type transistor and a drain terminal of the fourth N-type transistor and configured to compensate for a parameter of the fourth N-type transistor; and
a second offset compensating circuit, connected in parallel between a source terminal of the fifth N-type transistor and a drain terminal of the fifth N-type transistor and configured to compensate for a parameter of the fifth N-type transistor.

5. The data sampling circuit according to claim 4, wherein the first sampling circuit comprises:
a first P-type transistor, a first terminal of the first P-type transistor being connected to a high-level signal terminal, a control terminal of the first P-type transistor being connected to the first clock signal terminal;
a second P-type transistor, a first terminal of the second P-type transistor being connected to the second terminal of the first P-type transistor, a control terminal of the second P-type transistor being connected to a data signal terminal for receiving the data signal; and
a third P-type transistor, a first terminal of the third P-type transistor being connected to the second terminal of the first P-type transistor.

6. The data sampling circuit according to claim 5, wherein the decision feedback equalization module comprises:
a first decision feedback equalization module, connected in parallel between a source terminal of the fourth N-type transistor and a drain terminal of the fourth N-type transistor and configured to compensate for a parameter of the fourth N-type transistor; and
a second decision feedback equalization module, connected in parallel between a source terminal of the fifth N-type transistor and a drain terminal of the fifth N-type transistor and configured to compensate for a parameter of the fifth N-type transistor;
wherein the first decision feedback equalization module and the second decision feedback equalization module are controlled by two reverse signals and are driven by one of the two reverse signals.

7. The data sampling circuit according to claim 1, wherein the latch module comprises:
a sixth P-type transistor, a first terminal of the sixth P-type transistor being connected to a high-level signal terminal, a control terminal of the sixth P-type transistor being connected to the second output terminal, and a second terminal of the sixth P-type transistor being connected to the first output terminal;
a seventh N-type transistor, a first terminal of the seventh N-type transistor being connected to a third node for receiving the third signal, a second terminal of the seventh N-type transistor being connected to the first output terminal, and a control terminal of the seventh N-type transistor being connected to the second output terminal;
an eighth P-type transistor, a first terminal of the eighth P-type transistor being connected to the high-level signal terminal, a control terminal of the eighth P-type transistor being connected to the first output terminal, and a second terminal of the eighth P-type transistor being connected to the second output terminal; and
a ninth N-type transistor, a first terminal of the ninth N-type transistor being connected to a fourth node for receiving the fourth signal, a second terminal of the ninth N-type transistor being connected to the second output terminal, and a control terminal of the ninth N-type transistor being connected to the first output terminal.

8. The data sampling circuit according to claim 6, wherein the first decision feedback equalization module comprises:
a plurality of tenth N-type transistors, a first terminal of each of the plurality of tenth N-type transistors being connected to the third node, and a control terminal of each of the plurality of tenth N-type transistors being connected to the second node;
a plurality of eleventh transistors arranged in one-to-one correspondence with the plurality of tenth N-type transistors, a first terminal of each of the plurality of eleventh transistors being connected to a second terminal of each of the plurality of tenth N-type transistors, and a control terminal of each of the plurality of eleventh transistors being respectively connected to different control signal terminals; and
a plurality of twelfth N-type transistors arranged in one-to-one correspondence with the plurality of eleventh transistors, a first terminal of each of the plurality of twelfth N-type transistors being connected to a second terminal of each of the plurality of eleventh transistors, a control terminal of each of the plurality of twelfth N-type transistors being connected to a first control signal terminal, and a second terminal of each of the plurality of twelfth N-type transistors being connected to a low-level signal terminal.

9. The data sampling circuit according to claim 8, wherein number of the plurality of tenth N-type transistors, number of the plurality of eleventh transistors and number of the plurality of twelfth N-type transistors are two, respectively.

10. The data sampling circuit according to claim 8, wherein the second decision feedback equalization module comprises:
   a plurality of thirteenth N-type transistors, a first terminal of each of the plurality of thirteenth N-type transistors being connected to the fourth node, and a control terminal of each of the plurality of thirteenth N-type transistors being connected to a first node for receiving the first signal;
   a plurality of fourteenth transistors arranged in one-to-one correspondence with the plurality of thirteenth N-type transistors, a first terminal of each of the plurality of fourteenth transistors being connected to a second terminal of each of the plurality of thirteenth N-type transistors, and a control terminal of each of the plurality of fourteenth transistors being respectively connected to different control signal terminals; and
   a plurality of fifteenth N-type transistors arranged in one-to-one correspondence with the plurality of fourteenth transistors, a first terminal of each of the plurality of fifteenth N-type transistors being connected to a second terminal of each of the plurality of fourteenth transistors, a control terminal of each of the plurality of fifteenth N-type transistors being connected to a second control signal terminal, and a second terminal of each of the plurality of fifteenth N-type transistors being connected to the low-level signal terminal;
   wherein a signal from the first control signal terminal and a signal from the second control signal terminal are reverse.

11. The data sampling circuit according to claim 10, wherein a number of the plurality of thirteenth N-type transistors, a number of the plurality of fourteenth transistors and a number of the plurality of fifteenth N-type transistors are two, respectively.

12. The data sampling circuit according to claim 4, wherein the second offset compensating circuit comprises:
   a plurality of sixteenth transistors, a first terminal of each of the plurality of sixteenth transistors being connected to the low-level signal terminal, and a control terminal of each of the plurality of sixteenth transistors being respectively connected to different control signal terminals; and
   a plurality of first capacitors arranged in one-to-one correspondence with the plurality of sixteenth transistors, each of the plurality of first capacitors being connected between a second terminal of each of the plurality of sixteenth transistors and the third node.

13. The data sampling circuit according to claim 4, wherein the second offset compensating circuit comprises:
   a plurality of seventeenth transistors, a first terminal of each of the plurality of seventeenth transistors being connected to the low-level signal terminal, and a control terminal of each of the plurality of seventeenth transistors being respectively connected to different control signal terminals; and
   a plurality of second capacitors arranged in one-to-one correspondence with the plurality of seventeenth transistors, wherein each of the plurality of second capacitors is connected between a second terminal of each of the plurality of seventeenth transistors and the third node.

14. The data sampling circuit according to claim 1, wherein the data sampling circuit comprises:
   an eighteenth N-type transistor, a first terminal of the eighteenth N-type transistor being connected to a low-level signal terminal, a second terminal of the eighteenth N-type transistor being connected to a second node for receiving the second node, and a control terminal of the eighteenth N-type transistor being connected to the first clock signal terminal;
   a nineteenth N-type transistor, a first terminal of the nineteenth N-type transistor being connected to the low-level signal terminal, a second terminal of the nineteenth N-type transistor being connected to a first node for receiving the first signal, and a control terminal of the nineteenth N-type transistor being connected to the first clock signal terminal;
   a twentieth P-type transistor, a first terminal of the twentieth P-type transistor being connected to a high-level signal terminal, a second terminal of the twentieth P-type transistor being connected to a third node for receiving the third signal, and a control terminal of the twentieth P-type transistor being connected to the second clock signal terminal;
   a twenty-first P-type transistor, a first terminal of the twenty-first P-type transistor being connected to the high-level signal terminal, a second terminal of the twenty-first P-type transistor being connected to the first output terminal, and a control terminal of the twenty-first P-type transistor being connected to the second clock signal terminal;
   a twenty-second P-type transistor, a first terminal of the twenty-second P-type transistor being connected to the high-level signal terminal, a second terminal of the twenty-second P-type transistor being connected to the second output terminal, and a control terminal of the twenty-second P-type transistor being connected to the second clock signal terminal; and
   a twenty-third P-type transistor, a first terminal of the twenty-third P-type transistor being connected to the high-level signal terminal, a second terminal of the twenty-third P-type transistor being connected to a fourth node for receiving the fourth signal, and a control terminal of the twenty-third P-type transistor being connected to the second clock signal terminal.

15. A data sampling device, comprising a plurality of cascaded data sampling circuits according to claim 1, wherein a first output terminal of a given one of the plurality of data sampling circuits at a previous stage is connected to a first control terminal of an adjacent one of the plurality of data sampling circuits at a next stage, and a second output terminal of the data sampling circuit at the previous stage being connected to a second control terminal of the adjacent data sampling circuit at the next stage; and
   wherein a first output terminal of the data sampling circuit at a last stage is connected to a first control terminal of the data sampling circuit at a first stage, and a second output terminal of the data sampling circuit at the last stage being connected to a second control terminal of the data sampling circuit at the first stage.

16. The data sampling device according to claim 15, further comprising a plurality of latches, the plurality of latches being arranged in one-to-one correspondence with the plurality of data sampling circuits, wherein the plurality of latches are configured to latch data from the first output terminals of the plurality of data sampling circuits at a third output terminal, and latch data from the second output terminals of the plurality of data sampling circuits at a fourth output terminal.

17. The data sampling device according to claim 16, wherein each of the plurality of latches comprises:
 a twenty-fourth P-type transistor, a first terminal of the twenty-fourth P-type transistor being connected to a high-level signal terminal, a second terminal of the twenty-fourth P-type transistor being connected to the third output terminal, and a control terminal of the twenty-fourth P-type transistor being connected to the first output terminal of each of the plurality of data sampling circuits;
 a twenty-fifth P-type transistor, a first terminal of the twenty-fifth P-type transistor being connected to the high-level signal terminal, a second terminal of the twenty-fifth P-type transistor being connected to the third output terminal, and a control terminal of the twenty-fifth P-type transistor being connected to the fourth output terminal;
 a twenty-sixth P-type transistor, a first terminal of the twenty-sixth P-type transistor being connected to the high-level signal terminal, a second terminal of the twenty-sixth P-type transistor being connected to the fourth output terminal, and a control terminal of the twenty-sixth P-type transistor being connected to the third output terminal;
 a twenty-seventh P-type transistor, a first terminal of the twenty-seventh P-type transistor being connected to the high-level signal terminal, a second terminal of the twenty-seventh P-type transistor being connected to the fourth output terminal, and a control terminal of the twenty-seventh P-type transistor being connected to the second output terminal of each of the plurality of data sampling circuits;
 a twenty-eighth N-type transistor, a first terminal of the twenty-eighth N-type transistor being connected to a low-level signal terminal, a second terminal of the twenty-eighth N-type transistor being connected to the third output terminal, and a control terminal of the twenty-eighth N-type transistor being connected to the first output terminal of each of the plurality of data sampling circuits;
 a twenty-ninth N-type transistor, a first terminal of the twenty-ninth N-type transistor being connected to the low-level signal terminal, a second terminal of the twenty-ninth N-type transistor being connected to the third output terminal, and a control terminal of the twenty-ninth N-type transistor being connected to the fourth output terminal;
 a thirtieth N-type transistor, a first terminal of the thirtieth N-type transistor being connected to the low-level signal terminal, a second terminal of the thirtieth N-type transistor being connected to the fourth output terminal, and a control terminal of the thirtieth N-type transistor being connected to the third output terminal; and
 a thirty-first N-type transistor, a first terminal of the thirty-first N-type transistor being connected to the low-level signal terminal, a second terminal of the thirty-first N-type transistor being connected to the fourth output terminal, and a control terminal of the thirty-first N-type transistor being connected to the second output terminal of each of the plurality of data sampling circuits.

18. The data sampling device according to claim 16, wherein the data sampling device comprises four data sampling circuits, the data sampling device further comprising:
 a clock circuit, configured to provide clock sampling signals to first clock signal terminals of the four data sampling circuits, wherein a phase difference between the clock sampling signals on the first clock signal terminals of the adjacent data sampling circuits is 90 degrees, and a period of each of the clock sampling signals on the first clock signal terminals being twice that of a signal on a data signal terminal.

\* \* \* \* \*